(12) United States Patent
Van Schayck et al.

(10) Patent No.: US 11,189,456 B2
(45) Date of Patent: Nov. 30, 2021

(54) SAMPLE INSPECTION METHOD AND SYSTEM

(71) Applicant: Universiteit Maastricht, Maastricht (NL)

(72) Inventors: Paul Van Schayck, Maastricht (NL); Raimond Ravelli, Maastricht (NL)

(73) Assignee: Universiteit Maastricht, Maastricht (NL)

( * ) Notice: Subject to any disclaimer, the term of this patent is extended or adjusted under 35 U.S.C. 154(b) by 0 days.

(21) Appl. No.: 16/968,396

(22) PCT Filed: Feb. 13, 2019

(86) PCT No.: PCT/EP2019/053606
§ 371 (c)(1),
(2) Date: Aug. 7, 2020

(87) PCT Pub. No.: WO2019/158617
PCT Pub. Date: Aug. 22, 2019

(65) Prior Publication Data
US 2020/0402761 A1 Dec. 24, 2020

(30) Foreign Application Priority Data
Feb. 13, 2018 (EP) .................................... 18156577

(51) Int. Cl.
*H01J 37/24* (2006.01)
*G01T 1/29* (2006.01)
*H01J 37/244* (2006.01)

(52) U.S. Cl.
CPC .......... *H01J 37/244* (2013.01); *G01T 1/2928* (2013.01); *H01J 2237/2441* (2013.01);
(Continued)

(58) Field of Classification Search
CPC ............. H01J 37/244; H01J 2237/2441; H01J 2237/2446; H01J 2237/24495; H01J 2237/24578; G01T 1/2928
(Continued)

(56) References Cited

U.S. PATENT DOCUMENTS 6,002,741 A * 12/1999 Eisen .................... G01T 1/2928
378/62
2014/0070098 A1* 3/2014 Sytar .................... H01J 37/145
250/307
(Continued)

OTHER PUBLICATIONS

Booth and Mooney, "Applications of electron-counting direct-detection cameras in high-resolution cryo-electron microscopy," Microscopy and Analysis, Sep. 2013 issue, pp. 13-21.
(Continued)

*Primary Examiner* — Nicole M Ippolito
(74) *Attorney, Agent, or Firm* — Karceski IP Law, PLLC

(57) ABSTRACT

A sample may be inspected by making particles traverse the sample. The particles that have traversed the sample hit a detector one-by-one. In response thereto, the detector provides a sequence of respective detection outputs. The sequence of respective detection outputs is processed so as to identify respective locations where respective incident particles have hit the detector. An image is generated on the basis of the respective locations that have been identified. In order to determine a location where an incident particle has hit the detector, an evaluation is made with regard to pre-established respective associations between, on the one hand, respective locations where incident particles have hit the detector and, on the other hand, respective detection outputs.

15 Claims, 6 Drawing Sheets

(52) U.S. Cl.
CPC .............. *H01J 2237/2446* (2013.01); *H01J 2237/24495* (2013.01); *H01J 2237/24578* (2013.01)

(58) Field of Classification Search
USPC ............ 250/306, 307, 309, 310, 311, 492.1, 250/492.2, 492.21, 492.22, 492.23, 492.3
See application file for complete search history.

(56) References Cited

U.S. PATENT DOCUMENTS

| | | |
|---|---|---|
| 2015/0276953 A1 | 10/2015 | Palomares |
| 2016/0284531 A1* | 9/2016 | Zaks ................. H01J 49/401 |
| 2018/0017685 A1 | 1/2018 | Cao |

OTHER PUBLICATIONS

Bruyndonckx et al., "Performance of a PET prototype demonstrator based on non-pixelated scintillators," 2004 IEEE Nuclear Science Symposium Conference Record Oct. 16-22, 2004 Rome, Italy, IEEE, Piscataway, NY, vol. 6, Oct. 16, 2004, pp. 3924-3927.
Esposito et al., "Energy sensitive Timepix silicon detector for electron imaging," Nuclear Instruments & Methods in Physics Research, Section A, vol. 652, No. 1, Feb. 4, 2011, pp. 458-461.
International Written Opinion and International Search Report dated Jun. 6, 2019, for International Patent Application No. PCT/EP2019/053606.
Aad, G., Abbott, B., and Abdallah, J. et al., The ATLAS Collaboration, "A neural network clustering algorithm for the ATLAS silicon pixel detector," Journal of Instrumentation, Institute of Physics Publishing, Bristol, GB, vol. 9, No. 9, Sep. 15, 2014.

* cited by examiner

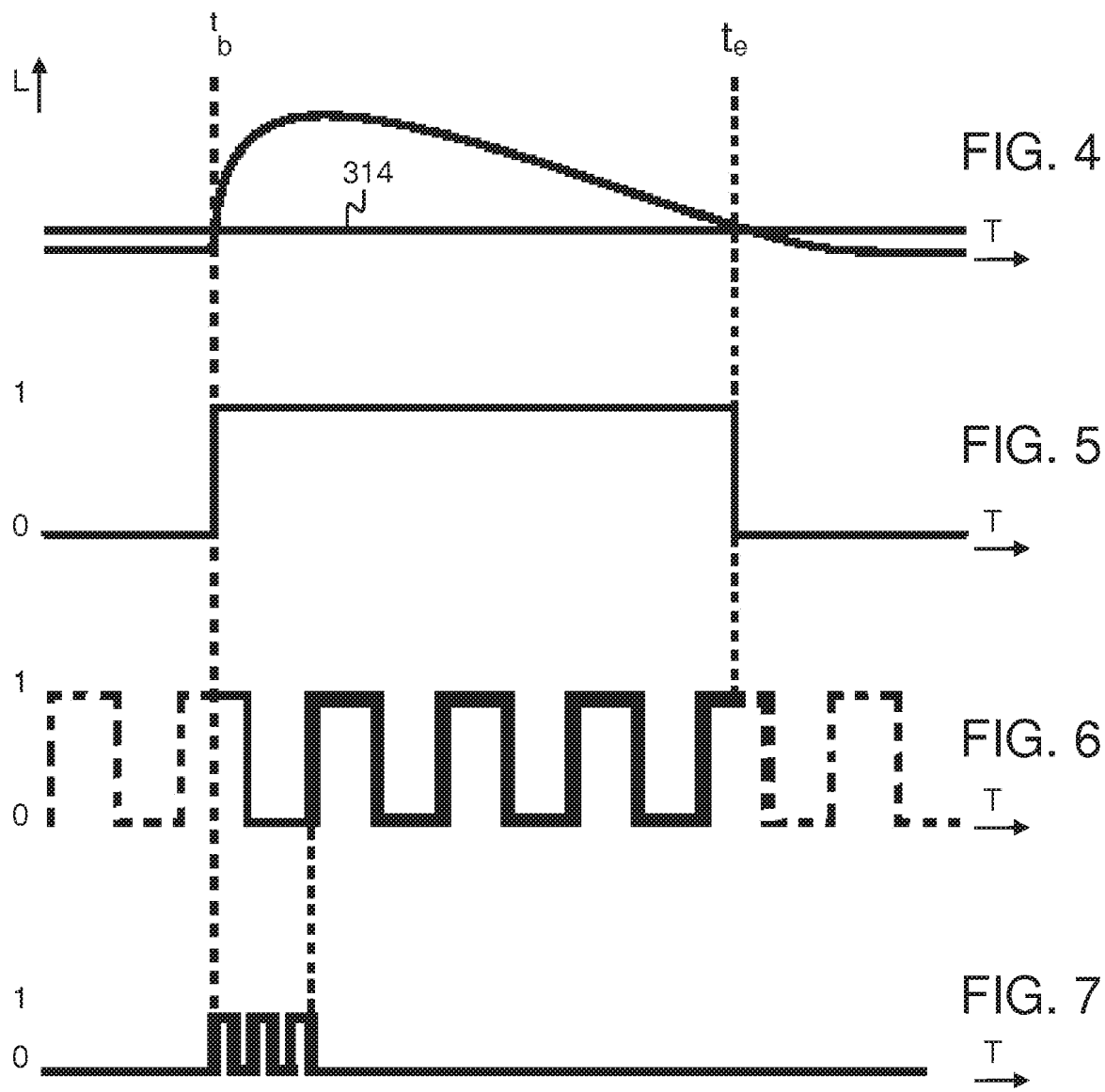

SAMPLE INSPECTION METHOD AND SYSTEM

CROSS-REFERENCE TO RELATED APPLICATIONS

This is a National Stage Entry into the United States Patent Office from International PCT Patent Application No. PCT/EP2019/053606. This patent application claims priority to and relies for priority on International PCT Patent Application No. PCT/EP2019/053606, filed on Feb. 13, 2019, and European Patent Application No. 18156577.1, filed on Feb. 13, 2018, the entire contents of both of which are incorporated herein by reference.

FIELD OF THE INVENTION

An aspect of the invention relates to a method of inspecting a sample by making particles traverse the sample. The method may be used in, for example, electron microscopy, in particular cryo-electron microscopy with direct electron detection. Other aspects of the invention relate to a sample inspection system, a method of configuring a sample inspection system, a computer program for n sample inspection system.

BACKGROUND OF THE INVENTION

The article entitled "Applications of electron-counting direct-detection cameras in high-resolution cryo-electron microscopy" by Christopher Booth and Paul Mooney in the September 2013 issue of Microscopy and Analysis, pages 13-21, describes electron detection technology in cryo-electron microscopy (cryo-EM). According to this article, atomic scale resolution in cryo-EM is now possible with the introduction of electron counting direct detection cameras which are commercially available. Direct detection cameras receive incoming electrons directly onto an imaging sensor. Most direct detection sensors are derived from active pixel sensor (APS) technology developed for digital cameras and cell phones. Advanced direct detection sensors are back-thinned allowing primary electrons to pass through the sensor, with no "bulk" support, which minimizes backscattering.

New modes of operation, such as electron counting and super-resolution, increase detective quantum efficiency (DQE), which is a critical performance metric, and hence increase the signal to noise ratio (SNR) of images. The electron counting mode of direct detection cameras replaces an analogue signal from each primary electron with a discrete count. The benefit of counting is that by rejecting read noise and by removing variability of an electron signal, it lifts the DQE (and MTF) of the detector across all spatial frequencies, MTF being an acronym for modulation transfer function, which is also a performance metric.

To detect and resolve individual electrons at dose rates typical of cryo-TEM (10 e-/pix/s), a camera needs to run very fast, at 400 fps. Think of photographing raindrops arriving on a sidewalk; if the camera is too slow, or the rain is too heavy, an image shows accumulated rainwater, whereas if the camera is fast and rainfall rate within range, individual raindrops (electrons) may be detected. In the super-resolution mode, each incoming electron may deposit signal in a small cluster of pixels. High-speed electronics can recognize each electron event (at 400 frames per second) and find the center of that event with sub-pixel precision.

SUMMARY OF THE INVENTION

There is a need for a solution that allows inspecting a sample by means of particles with better performance on at least one of the following points: radiation hardness, cost, and accuracy.

In order to better address this need, the following points have been taken into consideration. As the aforementioned article seems to indicate, a detector may comprise a sensor layer having a surface exposed to receive particles that have traversed a sample. An incident particle moving through the sensor layer may generate electron-hole pairs within the sensor layer. The detector may further comprise an array of respective sensor circuits adapted to provide respective detection outputs indicative of electron-hole pairs generated at respective locations within the sensor layer, The respective detection outputs of the detector may indicate that electron-hole pairs are generated in a cluster of locations. However, the center of this cluster does not necessarily accurately indicate a location where a particle was incident on the surface of the detector. This is because the particle may exhibit lateral scattering when moving through the sensor layer, generating electron-hole pairs along its way. That is, the particle may follow a track in the sensor layer different from "straight down". The track may have a significant horizontal component in addition to a vertical component corresponding with straight down. Moreover, lateral scattering may have a random character.

Lateral scattering may be reduced by making the sensor layer thinner, by increasing energy of incident electrons, or by providing a sensor layer of specific material, or a combination of these measures. However, increasing the energy of incident electrons may not be suitable or even possible. Back-thinning involves costs. Using specific materials for the sensor layer may also involve costs. What is more, the thinner a sensor layer is, the less robust the detector will be, mechanically and also electrically. The sensor layer typically constitutes a shield that may prevent incident particles from electrically damaging sensor circuits. The thinner this shield is, the more vulnerable the sensor circuits are. In addition, if the sensor layer is made too thin, there is a significant probability that an incident electron will go undetected.

The inventors have recognized that although lateral scattering has a random character, stochastic associations can be made between respective clusters observed in respective detection outputs and respective locations where a particle is incident on the surface of the detector. These associations can be used to evaluate a cluster that occurs in detection outputs so as to determine a location where a particle was incident with sufficiently great accuracy and precision.

In accordance with an aspect of the invention, there is provided a method of inspecting a sample by means of a system that comprises:

an arrangement adapted to make particles traverse the sample to be inspected, a detector comprising:

a sensor layer having a surface exposed to receive the particles that have traversed the sample, whereby the particles hit the surface of the sensor layer one-by-one, and whereby a particle moves along an erratic track through the sensor layer losing its energy along the erratic track thereby generating electron-hole pairs within the sensor layer; and an array of respective sensor circuits adapted to provide respective detection outputs indicative of electron-hole pairs generated at respective locations within the sensor layer, the method comprising:

an incident particle localization step in which respective detection outputs that the detector provides in response to an incident particle are processed so as to obtain a location identifier indicating where the incident particle has hit the surface of the sensor layer; and an image forming step in which an image is generated on the basis of respective location identifiers that have been obtained in response to respective incident particles within an interval of time, wherein the incident particle localization step comprises:

a cluster identification step in which a cluster of respective locations within the sensor layer where electron-hole pairs have been generated is identified on the basis of the respective detection outputs; and an location identification step in which a location where the particle has hit the surface of the sensor layer is determined on the basis of an evaluation of a set of respective detection outputs that are indicative of electron-hole pairs generated at the respective locations in the cluster, the evaluation being made with regard to pre-established respective associations between, on the one hand, respective locations where incident particles have hit the surface of the sensor layer and, on the other hand, respective sets of respective detection outputs indicative of electron-hole pairs generated at respective locations in respective clusters of locations.

In accordance with further aspects of the invention, a sample inspection system is provided, a method of configuring a system for inspecting a sample is provided, and a computer program for a system for inspecting a sample is provided.

In each of these aspects, significant lateral scattering that occurs in the sensor layer does not necessarily preclude a sufficiently accurate determination of a location where a particle was incident. Thus, sufficient accuracy and therefore sufficient image quality can be obtained even if the sensor layer is relatively thick, the energy of incident electrons is relatively low, or the sensor layer is made of relatively low cost material. The invention thus allows better meeting at least one of the following criteria: radiation hardness, moderate cost, and accuracy. Moreover, in case electrode-based sensor circuits are used, relatively high-speed imaging can be achieved.

For the purpose of illustration, some embodiments of the invention are described in detail with reference to accompanying drawings. This description will present features additional to those mentioned hereinbefore, as well as advantages which these additional features can provide.

BRIEF DESCRIPTION OF THE DRAWINGS

FIG. 4 is a time diagram of an output signal of an amplifier in the electron-hole detector circuit.

FIG. 5 is a time diagram of a binary output signal of a comparator in the electron-hole detector circuit.

FIG. 6 is a time diagram of a gated low-frequency clock signal in the electron-hole detector circuit.

FIG. 7 is a time diagram of a gated high-frequency clock signal in the electron-hole detector circuit.

DESCRIPTION OF EMBODIMENTS OF THE INVENTION

Figure 1:
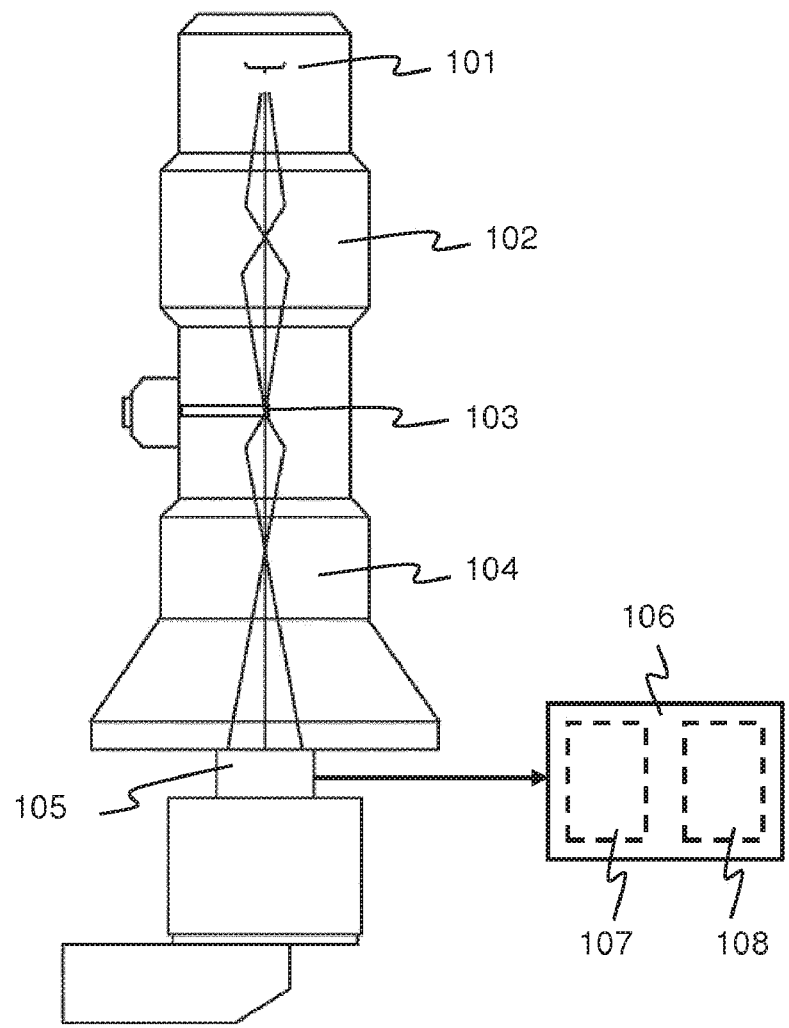
FIG. 1 is a schematic diagram of an electron microscopy system.

FIG. 1 schematically illustrates an electron microscopy system 100. The electron microscopy system 100 may be, for example, of the TEM type, TEM being an acronym of transmission electron microscope. More specifically, the electron microscopy system 100 may be used for cryo-electron microscopy, which is a form of transmission electron microscopy where a sample to be imaged is at cryogenic temperatures.

The electron microscopy system 100 comprises an electron beam source 101, a condenser lens assembly 102, a sample holder 103, a projector lens assembly 104, a detector 105, and a data processor 106. The data processor 106 comprises an incident electron localization module 107 and an image forming module 108. The electron localization module 107 may be in the form of, for example, a software program that is stored in a program memory of the data processor 106 and that an instruction executing circuit in the data processor 106 may carry out. The same may apply to the image forming module 108. The program memory and the instruction executing circuit are not represented in FIG. 1 for the sake of simplicity. The electron microscopy system 100 may further comprise a controller, which may form part of, for example, the detector 105, or which may be a separate entity.

The electron microscopy system 100 basically operates as follows. The electron beam source 101 generates an electron beam, which is accelerated. The electron beam reaches the sample holder 103 through the condenser lens assembly 102. The electron beam traverses a sample that has been placed in the sample holder 103. Accordingly, an outgoing electron beam, which leaves the sample, carries an image of the sample. The projector lens assembly 104 magnifies the outgoing electron beam and projects a magnified outgoing electron beam on the detector 105. Electrons in the magnified outgoing electron beam that reach the detector 105 may have an energy level in the range of, for example, 80 kilo electron Volt (keV) to 300 keV The magnified outgoing electron beam may conceptually be regarded as a rain of respective electrons, which are incident on the detector 105 at respective instants. That is, the respective electrons of the magnified outgoing electron beam arrive one-by-one at the detector 105. This conceptual view of the magnified outgoing electron beam is particularly pertinent in case the sample receives a relatively low dose rate of electrons. For example, the sample may receive a dose rate lower than 40 electrons per square angstrom ($Å^2$) per second (s).

In response to an incident electron, the detector 105 provides output data indicating this event. In addition, the output data of the detector 105 comprises rudimentary information on where the electron has hit the detector 105.

The incident electron localization module 107 determines a location where an incident electron has hit the detector 105 on the basis of the rudimentary information comprised in the output data of the detector 105. Thus, in response to the output data of the detector 105 indicating that an electron has hit the detector 105, the incident electron localization module 107 provides a location identifier specifying a location where the electron has hit the detector 105. Accordingly, over time, the incident electron localization module 107 provides a sequence of respective location identifiers in response to respective incident electrons.

The image forming module 108 generates an image on the basis of the sequence of respective location identifiers that the incident electron localization module 107 provides within an interval of time. This interval of time is, in effect, an exposure time. The exposure time may be, for example, in the order of tenths of a second to seconds. The image forming module 108 may define a mapping scheme between, on the one hand, respective locations where incident electrons may hit the detector 105 and, on the other hand, respective pixels in the image.

In response to a location identifier, which specifies a location where an electron has hit the detector 105, the image forming module 108 may increment a value for a pixel that is associated with the location concerned according to the mapping scheme that applies. Accordingly, at the end of the exposure time, a pixel will have value that is a function of the number of times that a location identifier specifying a location associated with the pixel, has occurred in the sequence of respective location identifiers.

The mapping scheme may be dynamic to compensate for, for example, sample drift and sample deformation during the interval of time over which the image is formed. Sample drift and sample deformation can be expressed as local motion vectors, which may be non-uniform. The image forming module 108 may compensate for these types of motion in generating an image.

For example, in order to generate an image, the image forming module 108 may first generate a sequence of sub-frames during the exposure time. To that end, the image forming module 108 may, in effect, divide the exposure time into a sequence of sub time intervals. A sub-frame may be generated in a sub time interval in a manner as described hereinbefore with regard to generating an image. Motion compensation may be applied to align the sub-frames with respect to each other. In addition, filtering may be applied to the sub-frames, whereby filtering characteristics may differ from one sub-frame to another. The image forming module 108 may then combine aligned and filtered sub-frames so as to obtain an image of relatively high quality.

An another example, the image forming module 108 may adapt a mapping scheme from one incident electron to a subsequent incident electron that is detected, or from one series of successive incident electrons to a subsequent series of successive incident electrons. Motion compensation can thus also be applied by adapting the mapping scheme in this manner. Moreover, filtering may also be applied by adapting the mapping scheme for an incident electron, or a series of successive incident electrons, on the basis of previously detected incident electrons. In such an embodiment, there is no need for generating a sequence of sub-frames; an image may be formed directly.

Figure 2:
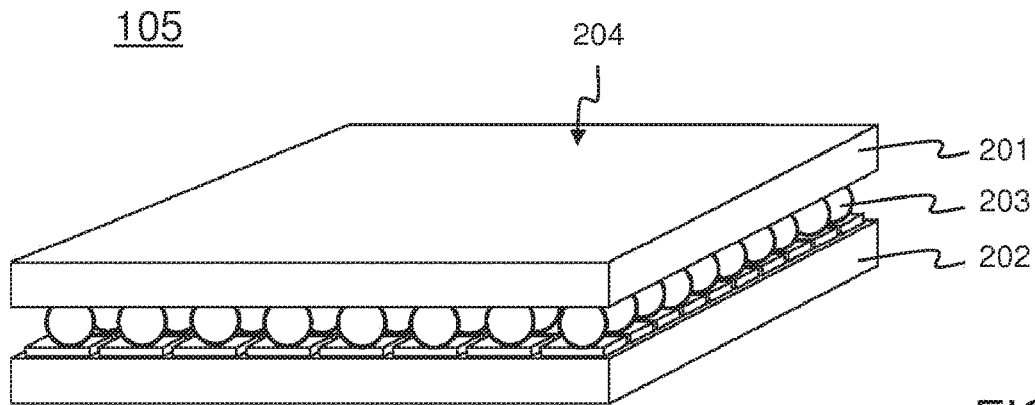
FIG. 2 is a perspective view of a detector in the electron microscopy system.
Figure 3:
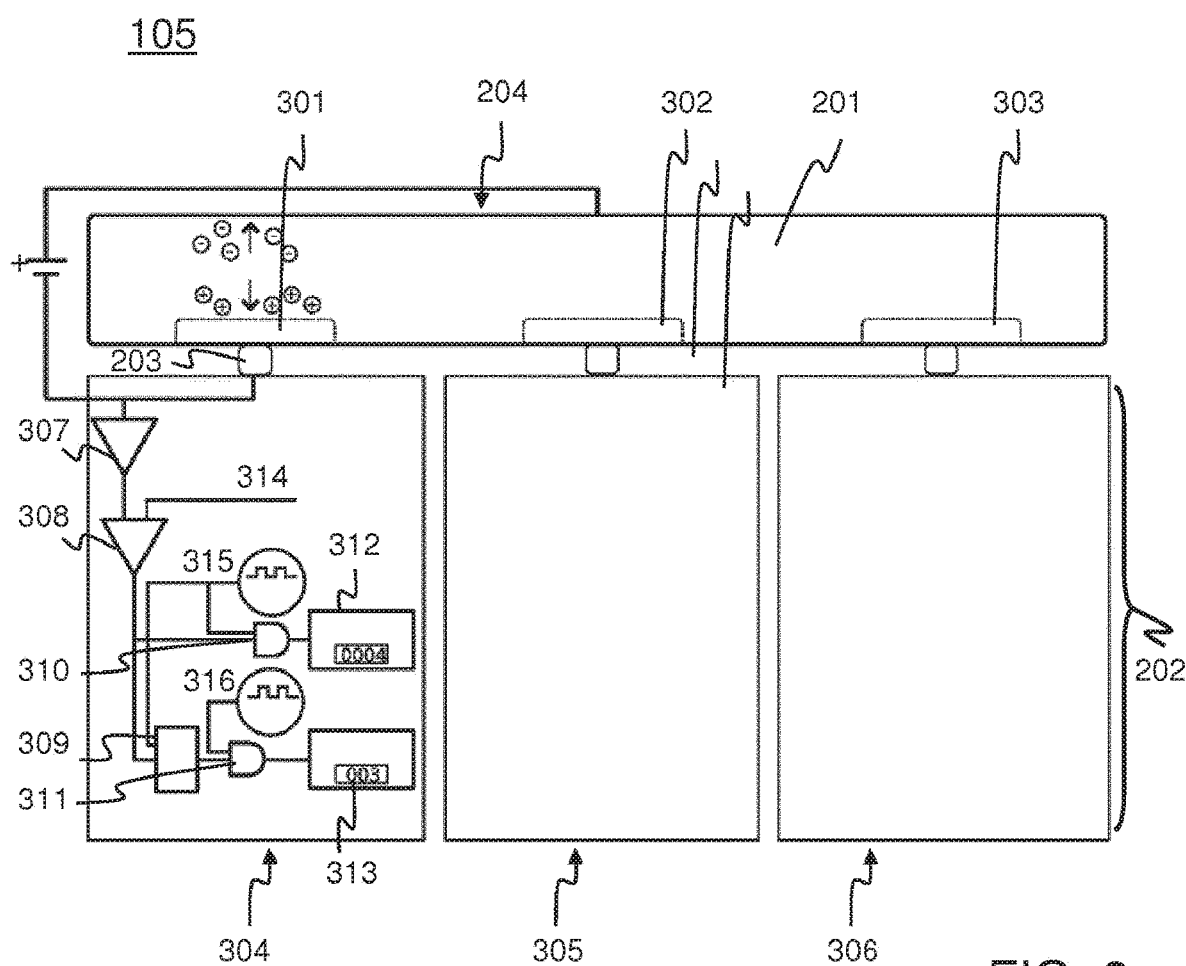
FIG. 3 is a cross sectional diagram of the detector, which includes a circuit diagram of an electron-hole detector circuit within the detector.

FIGS. 2 and 3 schematically illustrate in greater detail the detector 105 in the electron microscopy system 100. FIG. 2 provides a schematic perspective view of the detector 105. In FIG. 3, the detector 105 is represented in a schematic cross sectional diagram.

The detector 105 comprises an assembly of a sensor layer 201 and a readout chip 202. The detector 105 may comprise several of these assemblies arranged as a two-dimensional array, such as, for example, 4 assemblies arranged as a 2×2 array, or 16 assemblies arranges as a 4×4 array. The sensor layer 201 and the readout chip 202 are coupled to each other by means of solder bumps 203.

The sensor layer 201 has a substrate of which an upper face forms a surface 204 exposed to receive incident electrons. This surface will be referred to as the exposed surface 204 hereinafter. The substrate may comprise, for example, silicon. Alternatively, substrate may comprise, for example, at least one of the following substances: gallium arsenide, cadmium telluride, cadmium zinc telluride, selenium, and germanium. The readout chip 202 may be similar to an electronic integrated circuit comprising silicon, or another semiconductor material in which electronic circuits may be formed.

The sensor layer 201 may be at least 100 µm thick. For example, the sensor layer 201 may be 300 µm thick. Such a relatively important thickness may have several advantages. One advantage is that the sensor layer 201 may constitute a shield that protects electronic circuitry in the readout chip 202 from being damaged by incident electrons that hit the upper face of the sensor layer 201. Another advantage is that an incident electron will release a substantial amount of its energy when moving though the sensor layer 201. The incident electron may even lose all of its energy. This released energy, which goes into the sensor layer 201, can be used for detection purposes, which contributes to reliably detecting the incident electron.

A disadvantage of the sensor layer 201 being relatively thick is that incident electrons will generally exhibit lateral scattering when moving through the sensor layer 201. That is, an incident electron will follow a path through the sensor layer 201 that may have a significant lateral component.

Referring to FIG. 3, the sensor layer 201 comprises P-doped regions 301, 302, 303, which may be arranged as a two-dimensional array. These P-doped regions 301, 302, 303 constitute electrodes. The sensor layer 201 may comprise, for example, an array of 256×256 of such electrodes 301, 302, 303. Thus, in case the detector 105 comprises 4 assemblies of a sensor layer and a readout chip, similar to the one illustrated in FIG. 3, arranged as a 2×2 array, the detector 105 as a whole may comprise, for example, 512× 512 electrodes. The electrodes may be arranged as a grid with a grid resolution of, for example, 55 µm×55 µm, which implies that neighboring electrodes are spaced 55 µm apart in a horizontal and in a vertical direction.

The readout chip 202 comprises electron-hole detector circuits 304, 305, 306, which may also be arranged as a two-dimensional array, similar to the P-doped regions 301, 302, 303 that constitute electrodes. An electron-hole detector circuit is uniquely coupled to an electrode by means of a solder bump. Together, the electrode and the electron-hole detector circuit form a sensor circuit adapted to provide a detection output indicative of electron-hole pairs generated at a location within the sensor layer 201, namely the location where the electrode is located.

FIG. 3 includes a conceptual functional diagram of an electron-hole detector circuit 304. The electron-hole detector circuit 304 comprises an amplifier 307, which is coupled to an electrode 301 by means of a solder bump 203. The electron-hole detector circuit 304 further comprises a comparator 308, a timing circuit 309, a first logic and gate 310 and a second logic and gate 311, a first counter 312 and a second counter 313. The electron-hole detector circuit 304 receives a threshold level 314, a low-frequency clock signal 315, and a high-frequency clock signal 316. The threshold level 314, the low-frequency clock signal 315 and the high-frequency clock signal 316 may centrally be generated in the readout chip 202 and applied to other comparators in other electron-hole detector circuits 305, 306. The low-frequency clock signal 315 may have a frequency of, for example, 40 MHz. The high-frequency clock signal 316 may have a frequency of, for example, 640 MHz.

The sensor circuit, which includes the electron-hole detector circuit 304 illustrated in FIG. 3, conceptually operates as follows. The electron-hole detector circuit 304 applies a bias voltage across the electrode 301 of the sensor circuit and the substrate of the sensor layer 201. In case an incident electron passes in the vicinity of the electrode 301 of the sensor circuit, electron-hole pairs are generated in the vicinity of the electrode 301. The bias voltage may have a polarity that causes holes of these generated electron-hole pairs to migrate to the electrode 301, as illustrated in FIG. 3. Electrons may migrate to another electrode in the substrate through which the bias voltage is applied. In the sequel, this will be assumed to be the case by way of illustration. Notwithstanding, the bias voltage may have an inverse polarity, which causes electrons to migrate to the electrode 301 and holes to migrate to the other electrode.

The amplifier 307, which is coupled to the electrode 301, receives an input signal as a result of holes arriving at the electrode 301. The amplifier 307 amplifies this input signal and provides an output signal representative of the electron-hole pairs that have been generated in the vicinity of the electrode 301. The output signal exhibits a certain delay due to migration of holes and electrons as described hereinbefore.

FIG. 4 schematically illustrates an example of the output signal of the amplifier 307 when an incident electron passes in the vicinity of the electrode 301 of the sensor circuit. The output signal is schematically represented in a time diagram, which has a horizontal axis representing time T, and a vertical axis representing signal level L. In this example, the output signal has a relatively steep front slope and a relatively gentle trailing slope.

The comparator 308 compares the output signal of the amplifier 307 with the threshold level 314. The comparator 308 provides a binary output signal that indicates whether the output signal of the amplifier 307 is above or below the threshold level 314. The threshold level 314 may conceptually be regarded as representing a minimum amount of electron-hole pairs for incident electron detection by the sensor circuit.

FIG. 5 schematically illustrates an example of the binary output signal of the comparator 308. The binary output signal is schematically represented in a time diagram, which has a horizontal axis corresponding with that in FIG. 4, representing time T, and a vertical axis representing binary values, one designated as zero (0) the other binary value is designated as one (1). The comparator 308 provides the binary output signal illustrated in FIG. 5 in response to the output voltage signal illustrated in FIG. 4. In FIG. 4, the threshold level 314, which the comparator 308 receives, is indicated The binary output signal of the comparator 308 comprises a binary pulse that starts at an instant tb and that ends at an instant te. This is because the output voltage signal of the amplifier 307 is above the threshold level 314 between these instants, which define a duration of the pulse. The duration of the binary pulse is indicative of a quantity of electron-hole pairs that the incident electron has generated in the vicinity of the electrode 301. The larger the quantity of electron-hole pairs that are generated, the longer the duration of the pulse will be, and vice versa.

At the instant tb, when the binary pulse starts, a zero-to-one transition occurs in the binary output signal of the comparator 308. The zero-to-one transition indicates that a significant quantity of holes start to arrive at the electrode 301. The instant tb at which the zero-to-one transition occurs thus indicates a time of arrival at the electrode 301 of holes generated by the incident electron.

The first logic and gate 310 receives the binary output signal of the comparator 308 and the low-frequency clock signal 315. In response, the first logic and gate 310 provides a gated low-frequency clock signal. As mentioned hereinbefore, the frequency of the low-frequency clock signal 315 may be, for example, 40 MHz. In that case, a clock cycle in the low-frequency clock signal 315, as well as in the gated low-frequency signal, has a duration of 25 ns.

FIG. 6 schematically illustrates an example of the gated low-frequency clock signal. The gated low-frequency clock signal is schematically represented in a time diagram, which has a horizontal axis corresponding with that in FIGS. 4 and 5, representing time T, and a vertical axis representing binary values, one designated as zero (0) the other binary value is designated as one (1). The gated low-frequency clock signal is schematically represented by full, unbroken lines. The first logic and gate 310 provides the gated low-frequency clock signal illustrated in FIG. 6 in response to the binary output signal of the comparator 308 illustrated in FIG. 5.

The gated low-frequency clock signal comprises a number of rising edges of contiguous clock cycles. This number depends on the duration of the pulse in the binary output signal of the comparator 308, of which an example is illustrated in FIG. 5. As explained hereinbefore, the duration of the pulse depends on the quantity of electron-hole pairs that the incident electron has generated in the vicinity of the electrode 301. Thus, the number of rising edges of contiguous clock cycles in the gated low-frequency clock signal is indicative of the quantity of generated electron-hole pairs. The first counter 312 counts the number of rising edges of contiguous clock cycles and provides this count as a digital output value.

The timing circuit 309 also receives the binary output signal of the comparator 308 and the low-frequency clock signal 315. In response, the timing circuit 309 provides a binary output pulse. This binary output pulse starts when a zero-to-one transition occurs in the binary output signal of the comparator 308. As explained hereinbefore, the zero-to-one transition marks an instant when a significant quantity of holes starts to reach the electrode 301. The binary output pulse ends when a clock cycle starts in the low-frequency clock signal 315. The start of a clock cycle constitutes a fixed point in time for all sensor circuits in the readout chip 202.

The binary output pulse of the timing circuit 309 has a duration that indicates a time of arrival at the electrode 301 of holes of the electron-hole pairs that the incident electron has generated. The sooner the holes reach the electrode 301, the sooner the one-to-zero transition in the binary output signal of the comparator 308 will occur, and, consequently, the longer the duration of the binary output pulse of the timing circuit 309 will be.

The second logic and gate 311 receives the binary output pulse from the timing circuit 309 and the high-frequency clock signal 316. In response, the second logic and gate 311 provides a gated high-frequency clock signal. As mentioned hereinbefore, the frequency of the high-frequency clock signal 316 may be, for example, 640 MHz. In that case, a clock cycle in the high-frequency clock signal 316, as well as in the gated high-frequency clock signal, has a duration of 1.56 ns.

FIG. 7 schematically illustrates an example of the gated high-frequency clock signal. The gated high-frequency clock signal is schematically represented in a time diagram, which has a horizontal axis corresponding with that in FIGS. 4-6, representing time T, and a vertical axis representing binary values, one designated as zero (0) the other binary value is designated as one (1). The second logic and gate 311 provides the gated high-frequency clock signal illustrated in FIG. 7 in response to the binary pulse that the timing circuit 309 provides as described hereinbefore.

The gated high-frequency clock signal comprises a number of contiguous clock cycles that depends on the duration of the binary output pulse of the timing circuit 309. As explained hereinbefore, the duration of the output pulse indicates the time of arrival at the electrode 301 of holes of the electron-hole pairs that the incident electron has generated. Thus, the number of contiguous clock cycles in the gated high-frequency clock signal is indicative of this time of arrival. The second counter 313 counts the number of contiguous clock cycles and provides this count as an additional digital output value.

The sensor circuit thus provides a detection output indicative of electron-hole pairs that the incident electron has generated in the vicinity of the electrode 301. In this embodiment, the detection output comprises the digital value of the first counter 312 and the additional digital value of the second counter 313. The digital value of the first counter 312 constitutes a quantity metric indicative of a quantity of electron-hole pairs that have been generated in the vicinity of the electrode 301. The additional digital value of the second counter 313 constitutes a time metric indicative of the time of arrival at the electrode 301.

Other sensor circuits in the detector 105 may operate in a similar fashion. Accordingly, the output data of the detector 105 comprises respective detection outputs indicative of electron-hole pairs generated at respective locations within the sensor layer 201. In this embodiment, these respective locations correspond with the respective locations of the electrodes 301, 302, 303 in the sensor layer 201.

Figure 8:
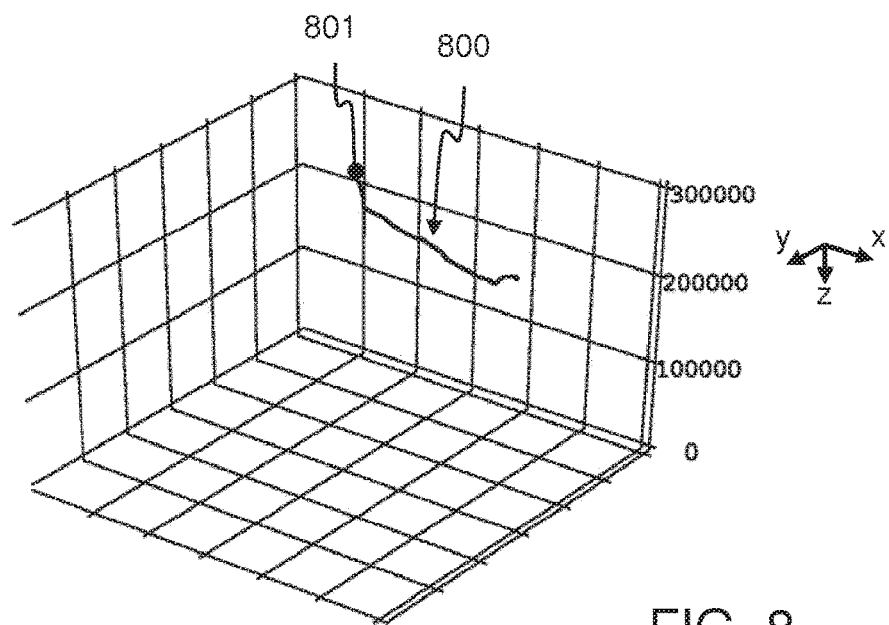
FIG. 8 is a three-dimensional graph of a track of an incident electron in a sensor layer of the detector.

FIG. 8 schematically illustrates an example of a track 800 of an incident electron in the sensor layer 201 of the detector 105 illustrated in FIGS. 2 and 3. The track 800 is represented in a three-dimensional coordinate system, which has an x-axis, a y-axis and a z-axis. The x-axis and the y-axis define a plane that is parallel with the exposed surface 204 of the sensor layer 201 and also parallel with the two-dimensional array of electrodes in the sensor layer 201. The z-axis corresponds with a thickness direction of the sensor layer 201.

In FIG. 8, a spot 801 marks a location where the incident electron has hit the exposed surface 204 of the sensor layer 201. The spot 801 thus marks the location that the image forming module 108 should ideally use for forming the image of the sample in the electron microscopy system 100 illustrated in FIG. 1. The spot 801 further marks the start of the track 800 that the incident electron follows when moving through the sensor layer 201. The track 800 illustrated in FIG. 8 ends when the incident electron has lost all of its energy. Since the sensor layer 201 is relatively thick, the track 800 may end before reaching a bottom part of the sensor layer 201.

The track 800 of the incident electron in the sensor layer 201 is rather erratic. First of all, the incident electron does not move straight down in the sensor layer 201, fully along z-axis. Instead, the incident electron exhibits lateral scattering. That is, the track 800 of the incident electron comprises a significant component along the x-axis, as well as a component along the y-axis. Secondly, movements along the aforementioned axes are quite nonlinear. For example, at the end of the track 800 the incident electron hardly exhibits a movement along the x-axis, whereas in the preceding part of the track 800 the incident electron exhibited a significant movement along the x-axis.

The incident electron loses its energy along the track 800 illustrated in FIG. 8. As a result, electron-hole pairs are generated in the sensor layer 201 along this track 800. In general, this is not a linear, deterministic process in which electron-hole pairs are evenly generated along the track 800. Rather, the incident electron will lose its energy along the track 800 in a stochastic fashion. This means that there most electron-hole pairs will be generated in some portion of the track 800. This portion is not determined in advance, but is most probably closer to the end of the track 800 than at the start.

The track 800 illustrated in FIG. 8 may cover several electrodes in the sensor layer 201 of the detector 105 illustrated in FIGS. 2 and 3. That is, when the track 800 is projected on the two-dimensional array of electrodes, several respective electrodes may be relatively close to the track 800. Accordingly, the respective sensor circuits to which these respective electrodes belong will all provide respective detection outputs, which comprise respective quantity metrics and respective time metrics. The respective quantity metrics are indicative of respective quantities of electron-hole pairs that are generated along the track 800.

Concerning the respective time metrics, the following is noted. The incident electron traverses the track 800 in a time that is negligibly short with respect to a typical time required for holes to migrate from a point in the track 800 to an electrode. Thus, the respective time metrics primarily indicate the respective delays for holes to reach the respective electrodes rather than respective instants at which electron-hole pairs have been generated along the track 800. It is recalled that, in this embodiment, the higher the value of a metric is, the shorter the delay is that the metric indicates. The time metrics thus indicate fastness of arrival, in a manner of speaking.

FIGS. 9-14 schematically illustrate various sets of detection outputs that the detector 105 described hereinbefore with reference to FIGS. 2-7 may provide in response to an incident electron. The sets of detection outputs are represented in the form of cartograms. The cartograms each comprise a two-dimensional array of 36 squares, having 6 rows of squares and 6 columns of squares. The two-dimensional array cartographically corresponds with a two-dimensional array of 36 electrodes in the sensor layer 201 of the detector 105. A square is thus uniquely associated with a sensor circuit and represents a metric that the sensor circuit provides, which may be a quantity metric or a time metric. A square has a grey-scale filling that represents the value of the metric.

Figure 9:
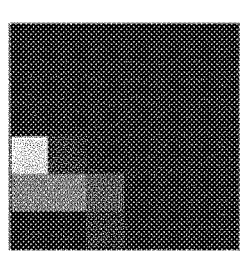
FIGS. 9-14 are cartograms of various sets of detection outputs, which the detector may provide.
Figure 10:
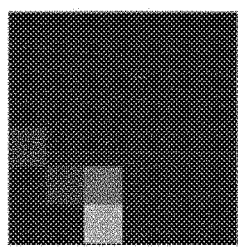

FIGS. 9 and 10 schematically illustrate a first set of detection outputs. More specifically, FIG. 9 illustrates a set of quantity metrics provided by a 6×6 array of sensor circuits. FIG. 10 illustrates a set of time metrics provided by the same 6×6 array of sensor circuits. The set of quantity metrics illustrated in FIG. 9 indicates a certain distribution of respective quantities of electron-hole pairs that have been generated at respective locations within the sensor layer 201. These respective locations form a cluster. The cluster is related to a track that the incident electron has followed when moving through the sensor layer 201. The set of time metrics illustrated in FIG. 10 indicates a certain distribution of respective times of arrival of holes of the electron-hole pairs at the respective electrodes of the 6×6 array of sensor circuits. The set of time metrics also comprises a cluster of time metrics that have a significant value.

Figure 11:
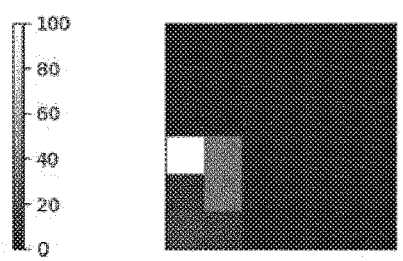
Figure 12:
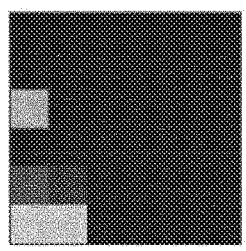

FIGS. 11 and 12 schematically illustrate a second set of detection outputs. More specifically, FIG. 11 illustrates a set of quantity metrics provided by a 6×6 array of sensor circuits. FIG. 12 illustrates a set of time metrics provided by the same 6×6 array of sensor circuits. The set of quantity metrics illustrated in FIG. 11 indicates a distribution of respective quantities of electron-hole pairs that is different from the distribution illustrated in FIG. 9. Here too, there is a cluster of respective locations corresponding with respective electrodes where electron-hole pairs are generated. The cluster is related to a track that the incident electron has followed, which may be different from the track that is related to the cluster illustrated in FIG. 9. The set of time metrics illustrated in FIG. 12 indicates a distribution of respective times of arrival of holes of the electron-hole pairs at the respective electrodes. This distribution is different from that illustrated in FIG. 10. There is a different cluster of time metrics that have a significant value.

Figure 13:
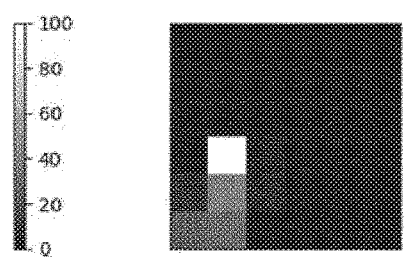
Figure 14:
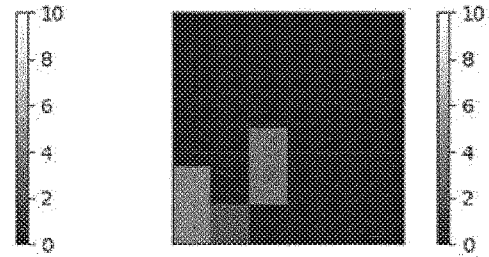

FIGS. 13 and 14 schematically illustrate a third set of detection outputs. More specifically, FIG. 13 illustrates a set of quantity metrics provided by a 6×6 array of sensor circuits. FIG. 14 illustrates a set of time metrics provided by the same 6×6 array of sensor circuits. The set of quantity metrics illustrated in FIG. 13 indicates a distribution of respective quantities of electron-hole pairs that is again different from the distributions illustrated in FIGS. 9 and 11. A point of similarity is that there is a cluster of respective locations corresponding with respective electrodes where electron-hole pairs are generated. The cluster is related to a track that the incident electron has followed, which may be different from the respective tracks that are related to the clusters illustrated in FIGS. 9 and 11. The set of time metrics illustrated in FIG. 14 shows a distribution of respective times of arrival of holes of the electron-hole pairs at the respective electrodes. This distribution is again different from that illustrated in FIGS. 10 and 12, but exhibits a cluster too.

In case multiple incident electrons hit the exposed surface 204 of the sensor layer 201, one by one, at an identical location, the detector 105 will typically provide a different set of detection outputs for each incident electron. This is because each incident electron will typically follow a different track in the sensor layer 201. Moreover, each incident electron will typically release its energy along the track according to a different distribution.

Respective sets of detection outputs obtained in response to respective incident electrons at an identical location may appear to be fully random. It thus appears to be difficult, if not impossible, to reliably determine a location where an incident electron has hit the exposed surface 204 of the sensor layer 201 on the basis of a set of detection outputs that the detector 105 provides in response to the incident electron.

However, the inventors have recognized that there is a stochastic relationship between a set of detection outputs that the detector 105 provides in response to an incident electron and a location where the incident electron has hit the exposed surface 204 of the sensor layer 201. Once such stochastic relationships have been determined, these can be used to sufficiently reliably determine a location where an incident electron has hit the exposed surface 204 of the sensor layer 201 on the basis of a set of detection outputs that the detector 105 provides.

Figure 15:
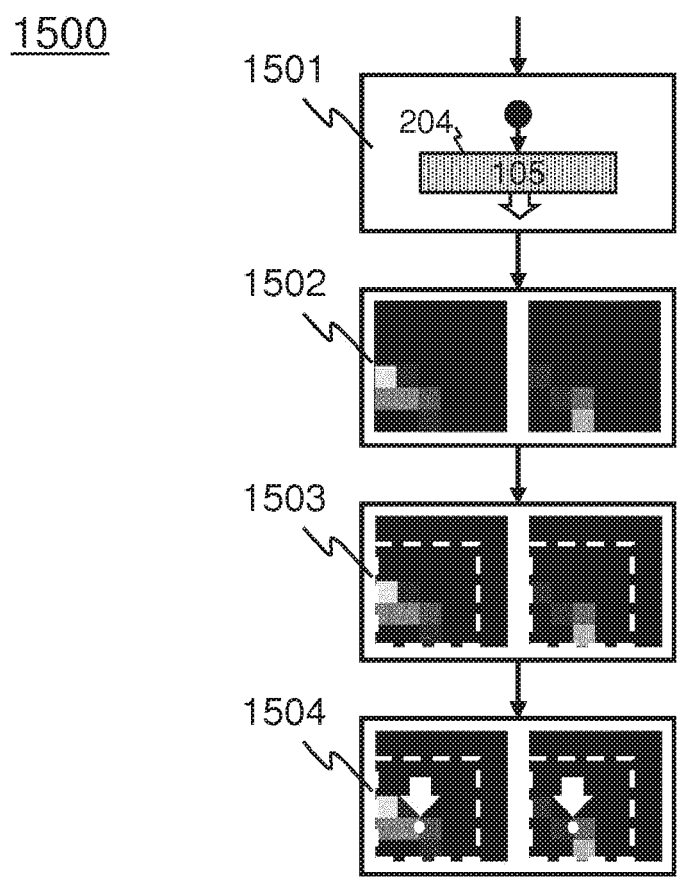
FIG. 15 is a flow chart of a method of localizing an incident particle on the basis of detection outputs from the detector.

FIG. 15 schematically illustrates a method of localizing an incident particle on the basis of detection outputs from the detector 105. This method is illustrated in a flow chart diagram. The method comprises a series of steps that the data processor 106 in the electron microscopy system 100 illustrated in FIG. 1 may carry out. The flow chart diagram of FIG. 15 may thus be regarded as a representation of at least a part of the incident electron localization module 107, which may be in the form of a software program as mentioned hereinbefore.

In an incident electron detection step 1501, the data processor 106 monitors the output data of the detector 105 so as to determine whether an electron has hit the exposed surface 204 of the sensor layer 201, or not. The data processor 106 may determine that an electron has hit the exposed surface 204 if, for example, at least one quantity metric in the output data exceeds a threshold value. In that case, the data processor 106 may carry out a cluster identification step 1502. Otherwise, the data processor 106 may continue carrying out the incident electron detection step 1501.

In the cluster identification step 1502, the data processor 106 analyzes the output data of the detector 105 so as to identify a cluster of respective locations within the sensor layer 201 where electron-hole pairs have been generated. The processor may make this analysis in the following manner. As mentioned hereinbefore, the output data of detector 105 comprises respective detection outputs that are associated with respective locations within the sensor layer 201. The processor may then verify whether respective detection outputs that are associated with respective locations that are neighboring to each other, simultaneously indicate that significant quantities of electron-hole pairs have been generated, or not, at these neighboring locations. The processor may identify a cluster on the basis of the respective quantity metrics that are comprised in the respective detection outputs.

In an output data selection step 1503, the processor selects a set of respective detection outputs that are indicative of electron-hole pairs generated at the respective locations in the cluster that has been identified. To that end, the processor may use a fixed-sized evaluation window that at least partially covers the cluster of respective locations that has been identified. For example, the fixed-sized evaluation window may correspond with a two-dimensional array of 4×4 electrodes in the sensor layer 201. The output data selection step 1503 may comprise a sub step of appropriately positioning the fixed-sized evaluation window so that the cluster that has been identified falls within this window, at least partially. The positioning of the fixed-sized evaluation window may be based on a predefined general rule. For example, according to this rule, a lower left corner of the fixed-sized evaluation window is aligned with a lower-left location in the cluster of locations that has been identified.

In a location determination step 1504, the data processor 106 determines a location where the incident electron has hit the exposed surface 204 of the sensor layer 201 on the basis of an evaluation of the set of respective detection outputs that has been selected. The evaluation is made with regard to pre-established respective associations between, on the one hand, respective locations where incident electrons have hit the exposed surface 204 of the sensor layer 201 and, on the other hand, respective sets of respective detection outputs indicative of electron-hole pairs generated at respective locations in respective clusters of locations. That is, the evaluation is based on output data that the detector 105 has previously been found to provide, either through measurement or through simulation, in response to electrons incident at various locations on the exposed surface 204 of the sensor layer 201. Indeed, based on responses that have been observed in the past, it is possible to accurately estimate the location where the incident electron has hit the exposed surface 204 of the sensor layer 201. As mentioned hereinbefore, the responses have a stochastic character but are far from being completely random.

The incident electron localization module 107 of the data processor 106 may comprise a neural network adapted to carry out the evaluation of the set of respective detection outputs that have been selected so as to determine the location where the incident electron has hit the exposed surface 204 of the sensor layer 201. The neural network may be of the convolution type. The neural network may be trained on the basis of the pre-established associations between, on the one hand, respective locations where incident electrons have hit the exposed surface 204 of the sensor layer 201 and, on the other hand, respective sets of respective detection outputs indicative of electron-hole pairs generated at respective locations in respective clusters of locations. An example of this training of the neural network will be described in greater detail hereinafter.

As indicated hereinbefore, training data for the neural network may be generated through simulation. To that end, a computer simulation tool can be designed that comprises, for example, a physical model of the sensor layer 201 and an electrical model of the sensor circuits within the detector 105. The physical model allows simulating physical processes that occur within the sensor layer 201 in response to an electron that is incident on the exposed surface 204. The computer simulation tool may allow defining several characteristics of such an incident electron, such as, for example, a location where the electron is incident on the exposed surface 204 and a level of energy that the electron has.

Based on the parameters of the incident electron, the computer simulation tool may then simulate a track that the incident electron may follow in the sensor layer 201, as well as a distribution of the energy that the incident electron will release along this track. Based on these simulations, the computer simulation tool may then calculate a three-dimensional distribution of quantities of electron hole pairs that are generated in the sensor layer 201 and a time distribution for this electron-hole pair generation. Subsequently, based on these distributions, the computer simulation tool may simulate migration of the electron-hole pairs that the incident electron has generated to respective electrodes in the sensor layer 201, which belong to respective sensor circuits.

The computer simulation tool may then determine, for an electrode, quantities of holes that reach the electrode as a function of time. Accordingly, the computer simulation tool may determine an input signal of the amplifier of the sensor circuit to which the electrode belongs. The computer simulation tool may then use the electrical model of the sensor circuit to determine a quantity metric and a time metric that the sensor circuit provides in response to the input signal. Accordingly, by doing the same for respective electrodes in the sensor layer 201, the computer simulation tool may simulate respective detection outputs that the detector 105 provides in response to the incident electron.

In order to generate sufficient training data for the neural network, numerous simulations may be made with numerous different incident locations. For example, 50,000 simulations may be made, whereby each simulation concerns a unique incident location. These incident locations may be confined to an area of which an electrode forms a center and that extends half way to a neighboring electrode in a horizontal direction and in a vertical direction. It is sufficient to make simulations around a single electrode because results of these simulations may be valid too for incident electrons around other electrodes.

Figure 16:
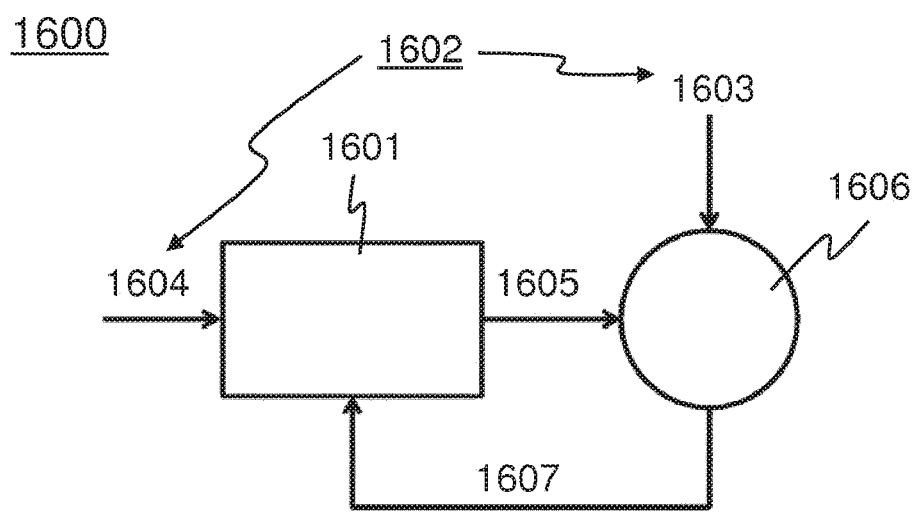
FIG. 16 is a block diagram of a method of training a neural network that may be used in the method of localizing an incident particle.

FIG. 16 schematically represents a method 1600 of training a neural network 1601 that is comprised in the data processor 106. The method is represented in a block diagram. The training of the neural network 1601 may be based on training data 1602 that has been generated through simulation as described hereinbefore, or may be based on training data that has been obtained in a different manner, for example, through measurements. In any case, the training data 1602 preferably comprises numerous different respective incident locations 1603 that are paired with respective sets of detection outputs 1604, which the detector 105 provides in response to electrons incident at these locations 1603.

In the training method 1600, the neural network 1601 receives a set of detection outputs 1604 as input data. The set of detection outputs 1604 is an element of the training data 1602 and is therefore paired with an incident location 1603. In response to the set of detection outputs 1604, the neural network 1601 provides an evaluation-based incident location 1605. The evaluation-based incident location 1605 that the neural network 1601 provides depends on respective parameters that have been assigned to respective connections between respective neurons in the neural network 1601. A parameter that has been assigned to a connection may comprise a weight.

The evaluation-based incident location 1605 that the neural network provides is compared 1606 with the incident location 1603 that is paired with the set of detection outputs 1604 in the training data 1602. The respective parameters of the respective connections in the neural network 1601 are adjusted on the basis of a difference 1607 between the evaluation-based incident location 1605 and the incident location concerned 1603 from the training data 1602. This process may be repeated using respective other sets of detection outputs from the training data 1602, which are paired with respective other incident locations.

Figure 17:
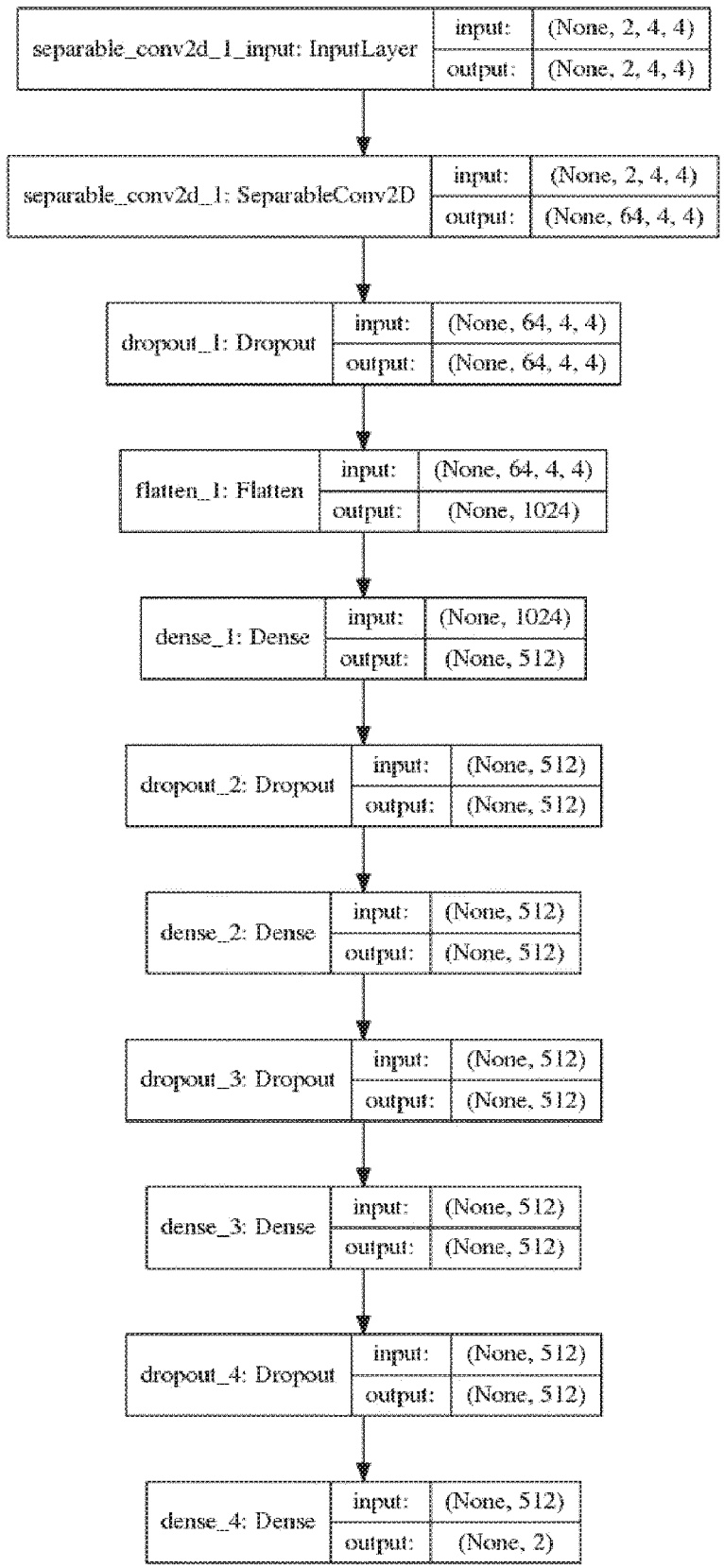
FIG. 17 is a flow diagram of a neural network that may be used in the method of localizing an incident particle

FIG. 17 illustrates an example of a neural network 1700 that may be used in the method of localizing an incident particle described hereinbefore with reference to FIG. 15. The neural network 1700 is represented in a flow diagram. The neural network 1700 may be implemented in, for example, a so-called Keras framework.

In the example illustrated in FIG. 17, the neural network 1700 receives a set of 4×4 detection outputs comprising 4×4 quantity metrics and 4×4 time metrics. That is, the example is based on an embodiment in which the incident electron localization module 107 applies a 4×4 fixed-sized evaluation window to the respective detections outputs that the detector 105 provides. The neural network 1700 may be trained as described hereinbefore with reference to FIG. 16.

The embodiments described with reference to the drawings allow improved detective quantum efficiency (DQE) over a wider range of energy levels of incident particles.

The embodiments described hereinbefore with reference to the drawings are presented by way of illustration. The invention may be implemented in numerous different ways. In order to illustrate this, some alternatives are briefly indicated.

The invention may be applied in numerous types of products and methods that involve inspecting a sample. In the presented embodiments, sample inspection involves an electron microscopy system that operates in imaging mode. In other embodiments, sample inspection may also be done in an electron microscopy system that operates in diffraction mode. In yet other embodiments, sample inspection according to the invention may be done in, for example, an x-ray system.

The term "particle" should thus be understood in a broad sense. The term may embrace any type of ionizing object or radiation capable of generated electron-hole pairs in a sensor layer of a system or method in accordance with the invention. Indeed, there is wave-particle duality: a particle may be described in terms of waves, and vice versa.

The term "image" should thus be understood in a broad sense. The term may embrace any type of multidimensional representation of at least one characteristic of a sample, which may be other than a visual representation.

There are numerous different ways of implementing a detector in a system or method in accordance with the invention. In the presented embodiments, the detector comprises electrodes and sensor circuits that provide detection outputs based on signals from these electrodes. In other embodiments, a detector may comprise, for example, detection circuits similar to active pixel sensors.

There are numerous different ways of implementing a localization processor in a system in accordance with the invention. In the presented embodiments, the localization processor comprises a convolution neural network. In other embodiments, the localization processor may comprise, for example, a stochastic processor.

In general, there are numerous different ways of implementing the invention, whereby different implementations may have different topologies. In any given topology, a single entity may carry out several functions, or several entities may jointly carry out a single function. In this respect, the drawings are very diagrammatic. There are numerous functions that may be implemented by means of hardware or software, or a combination of both. A description of a software-based implementation does not exclude a hardware-based implementation, and vice versa. Hybrid implementations, which comprise one or more dedicated circuits as well as one or more suitably programmed processors, are also possible. For example, various functions described hereinbefore with reference to the figures may be implemented by means of one or more dedicated circuits, whereby a particular circuit topology defines a particular function.

There are numerous ways of storing and distributing a set of instructions, that is, software, which allows a sample inspection system to operate in accordance with the invention. For example, software may be stored in a suitable device readable medium, such as, for example, a memory circuit, a magnetic disk, or an optical disk. A device readable medium in which software is stored may be supplied as an individual product or together with another product, which may execute the software. Such a medium may also be part of a product that enables software to be executed. Software may also be distributed via communication networks, which may be wired, wireless, or hybrid. For example, software may be distributed via the Internet. Software may be made available for download by means of a server. Downloading may be subject to a payment.

The remarks made hereinbefore demonstrate that the embodiments described with reference to the drawings illustrate the invention, rather than limit the invention. The invention can be implemented in numerous alternative ways that are within the scope of the appended claims. All changes that come within the meaning and range of equivalency of the claims are to be embraced within their scope. Any reference sign in a claim should not be construed as limiting the claim. The verb "comprise" in a claim does not exclude the presence of other elements or other steps than those listed in the claim. The same applies to similar verbs such as "include" and "contain". The mention of an element in singular in a claim pertaining to a product, does not exclude that the product may comprise a plurality of such elements. Likewise, the mention of a step in singular in a claim pertaining to a method does not exclude that the method may comprise a plurality of such steps. The mere fact that respective dependent claims define respective additional features, does not exclude combinations of additional features other than those reflected in the claims.

The invention claimed is:

1. A method of inspecting a sample by means of a system, comprising:
   an arrangement adapted to make particles traverse the sample to be inspected,
   a detector comprising:
      a sensor layer having a surface exposed to receive the particles that have traversed the sample, whereby the particles hit the surface of the sensor layer one-by-one, and whereby a particle moves along an erratic track through the sensor layer losing its energy along the erratic track thereby generating electron-hole pairs within the sensor layer; and
      an array of respective sensor circuits adapted to provide respective detection outputs indicative of electron-hole pairs generated at respective locations within the sensor layer,
   the method comprising:
   an incident particle localization step in which respective detection outputs that the detector provides in response to an incident particle are processed so as to obtain a location identifier indicating where the incident particle has hit the surface of the sensor layer; and
   an image forming step in which an image is generated on the basis of respective location identifiers that have been obtained in response to respective incident particles within an interval of time,
   wherein the incident particle localization step comprises:
      a cluster identification step in which a cluster of respective locations within the sensor layer where electron-hole pairs have been generated is identified on the basis of the respective detection outputs; and
      a location identification step in which a location where the particle has hit the surface of the sensor layer is determined on the basis of an evaluation of a set of respective detection outputs that are indicative of electron-hole pairs generated at the respective locations in the cluster, the evaluation being made with regard to pre-established respective associations between, on the one hand, respective locations where incident particles have hit the surface of the sensor layer and, on the other hand, respective sets of respective detection outputs indicative of electron-hole pairs generated at respective locations in respective clusters of locations.

2. A method of imaging a sample according to claim 1, wherein the evaluation involves a neural network that has been trained on the basis of the pre-established associations.

3. A method of inspecting a sample according to claim 2, wherein, prior to the location identification step, a fixed-sized evaluation window is defined, the fixed sized-window comprising respective locations that at least partially covers the cluster of respective locations that has been identified, the respective locations in the fixed-sized evaluation window being applied to the neural network whereby the neural network determines the location where the incident particle has hit the surface of the sensor layer.

4. A method of inspecting a sample according to claim 1, wherein the respective detection outputs on the basis of which the evaluation is made comprise respective quantity metrics, which are indicative of respective quantities of electron-hole pairs that have been generated at respective locations within the sensor layer.

5. A method of inspecting a sample according to claim 1, wherein the respective detection outputs on the basis of which the evaluation is made comprise respective time metrics, which are indicative of respective instants when respective sensor circuits have detected electron-hole pairs generated at respective locations within the sensor layer.

6. A method of inspecting a sample according to claim 1, wherein a location identifier is associated with a pixel in the image according to a mapping scheme that is adjusted during the interval of time.

7. A method of inspecting a sample according to claim 6, wherein the mapping scheme is adjusted to compensate for at least one of the following phenomena: drift of a sample through which the particles incident on the detector have passed and deformation of the sample.

8. A method of inspecting a sample according to claim 1, wherein the particles that traverse the sample comprise electrons.

9. A computer program for a sample inspection system, comprising:
an arrangement adapted to make particles traverse the sample to be inspected,
a detector comprising:
a sensor layer having a surface exposed to receive the particles that have traversed the sample, whereby the particles hit the surface of the sensor layer one-by-one, and whereby a particle moves along an erratic track through the sensor layer losing its energy along the erratic track thereby generating electron-hole pairs within the sensor layer; and
an array of respective sensor circuits adapted to provide respective detection outputs indicative of electron-hole pairs generated at respective locations within the sensor layer,
the computer program enabling a data processor in the sample inspection system to carry out the method of inspecting a sample according claim 1.

10. A sample inspection system, comprising:
an arrangement adapted to make particles traverse the sample to be inspected,
a detector comprising:
a sensor layer having a surface exposed to receive the particles that have traversed the sample, whereby the particles hit the surface of the sensor layer one-by-one, and whereby a particle moves along an erratic track through the sensor layer losing its energy along the erratic track thereby generating electron-hole pairs within the sensor layer; and
an array of respective sensor circuits adapted to provide respective detection outputs indicative of electron-hole pairs generated at respective locations within the sensor layer,
a data processor comprising:
an incident particle localization module adapted to process respective detection outputs that the detector provides in response to an incident particle are processed so as to obtain a location identifier indicating where the incident particle has hit the surface of the sensor layer; and
an image forming module adapted to generate an image on the basis of respective location identifiers that have been obtained in response to respective incident particles within an interval of time,
wherein the incident particle localization module is adapted to identify a cluster of respective locations within the sensor layer where electron-hole pairs have been generated on the basis of the respective detection outputs, and to determine a location where an incident particle has hit the surface of the sensor layer on the basis of an evaluation of a set of respective detection outputs that are indicative of electron-hole pairs generated at the respective locations in the cluster, the evaluation being made with regard to pre-established respective associations between, on the one hand, respective locations where incident particles have hit the surface of the sensor layer and, on the other hand, respective sets of respective detection outputs indicative of electron-hole pairs generated at respective locations in respective clusters of locations.

11. A sample inspection system, according to claim 10, wherein the respective sensor circuits comprise respective electrodes in the sensor layer, the respective sensor circuits being adapted to provide the respective detection outputs as a function of respective signals from the respective electrodes.

12. A sample inspection system, according to claim 11, wherein a sensor circuit comprises a comparator adapted to determine whether a signal from an electrode belonging to the sensor circuit is above or predefined threshold, or not, the sensor circuit being adapted to provide a quantity metric as a function of an interval of time ($t_b$, $t_e$) during which the signal is above the threshold.

13. A sample inspection system, according to claim 12, wherein the sensor circuit is adapted to provide a time metric as a function of an instant ($t_b$) at which the interval of time ($t_b$, $t_e$) during which the signal is above the threshold starts.

14. A sample inspection system according to claim 10, wherein the particles that traverse the sample comprise electrons.

15. A method of configuring a sample inspection system, according to claim 10, the method comprising:
a simulation step in which a model of the detector is used for simulating respective events where a particle is incident on the surface of the sensor layer at respective locations whereby, in these respective events, respective detection outputs indicative of electron-hole pairs are generated at respective locations within respective clusters of locations; and
a configuration step in which the respective events that have been simulated are applied to the incident particle localization module so as to provide the incident particle localization module with respective associations between, on the one hand, respective locations where incident particles have hit the surface of the sensor layer and, on the other hand, respective sets of respective detection outputs indicative of electron-hole pairs generated at respective locations in respective clusters of locations.

* * * * *